United States Patent [19]
Otto

[11] Patent Number: 5,164,968
[45] Date of Patent: Nov. 17, 1992

[54] NINE BIT GRAY CODE GENERATOR
[75] Inventor: Kurt J. Otto, Laguna Beach, Calif.
[73] Assignee: Loral Aerospace Corp., New York, N.Y.
[21] Appl. No.: 777,687
[22] Filed: Oct. 15, 1991
[51] Int. Cl.[5] .............................. G06F 11/00
[52] U.S. Cl. ............................ 377/34; 377/49
[58] Field of Search .................. 377/33, 34, 49

[56] References Cited
U.S. PATENT DOCUMENTS

| | | | |
|---|---|---|---|
| 3,209,347 | 9/1965 | Cutaia | 341/96 |
| 3,349,332 | 10/1967 | Bleickardt | 377/34 |
| 3,393,298 | 7/1968 | Olson | 377/33 |
| 3,588,461 | 6/1971 | Halsall | 377/34 |
| 3,600,686 | 8/1971 | Halsall | 377/48 |
| 4,119,961 | 10/1978 | Rockett, Jr. | 341/98 |
| 4,264,807 | 4/1981 | Moen et al. | 377/34 |
| 4,618,849 | 10/1986 | Bruestle | 341/98 |
| 4,745,630 | 5/1988 | Underwood | 377/33 |
| 4,781,894 | 10/1988 | Watkins et al. | 377/34 |
| 4,937,845 | 6/1990 | Warner | 377/34 |
| 5,084,841 | 1/1992 | Williams et al. | 377/34 |

Primary Examiner—Stanley D. Miller
Assistant Examiner—Scott A. Ouellette
Attorney, Agent, or Firm—Greg T. Sueoka; Edward J. Radlo

[57] ABSTRACT

A nine bit Gray code counter is constructed as a single integrated circuit such as a PLA and comprises D flip-flops, AND gates and Exclusive-OR gates. The array is programmed to provide a nine bit Gray code count at its outputs. The Q output of each flip-flop provides one bit in the Gray code count. The D input to each flip-flop is determined by the significance of the bit and the following equations: $D0 = A \text{ XOR } Q0$; $D1 = (\overline{A} \cdot Q0) \text{ XOR } Q1$; $Dn = (\overline{A} \cdot \ldots \cdot Qn-2 \cdot Qn-1) \text{ XOR } Qn$; and $Dmsb = (A \cdot \overline{Q0} \cdot \overline{Q1} \cdot \ldots \cdot Qmsb-2 \text{ XOR } Qmsb$.

9 Claims, 2 Drawing Sheets

NINE BIT GRAY CODE GENERATOR

BACKGROUND OF THE INVENTION

1. Field of the Invention

The present invention relates generally to integrated circuits and logic devices. In particular, the present invention relates to digital logic devices used as counters and generators.

2. Description of Related Art

There are many instances when low noise counters are required. A major source of noise in digital electronics is the simultaneous switching of several outputs at the same time. The simultaneous switching of several outputs is a common occurrence in binary counters where many of the outputs may change if the counter is clocked (e.g., when a binary counter transitions from the highest possible number to zero). When low noise counters are required, Gray code counters are typically used. Gray code counters advantageously change only one output or bit each time the counter is clocked or incremented. Thus, the noise from the simultaneous switching of several outputs is eliminated.

While the Gray code counters of the prior art have attempted to eliminate the noise problems of normal binary counters, the prior art Gray code counters have significant disadvantages. Some of the counters and generators of the prior art are disclosed in U.S. Pat. Nos. 3,209,347; 3,349,332; 3,393,298; 3,588,461; 3,600,686; 4,119,961; 4,264,807; 4,596,979; 4,618,849; and 4,780,894. A particular problem in the prior art is that Gray code counters are typically constructed using a combination of binary counters and Exclusive-OR gates. For example, the making of a nine bit Gray code counter commonly requires three 4-bit binary counters (74F161) and two quad two-input Exclusive-OR gates (74F86). Thus, a nine bit Gray code counter effectively requires five separate integrated circuits to be implemented. The use of five integrated circuits consumes more power, and requires a significant amount of space. Similarly, the teachings in U.S. Pat. No. 3,209,347 issued to Cutaia require 210 parts to construct a nine bit Gray code counter. The large number of parts increases the amount of power required and the size of the counter. Additionally, having to interconnect so many parts decreases the reliability of such Gray code counters. In applications such as aerospace, missiles and spacecraft where size and weight are at a premium, there is a need for a nine bit Gray code counter with reduced size and weight.

Another problem with the Gray code counters of the prior art is that noise is not completely eliminated. Since Gray code counters are often built from binary counters, the noise from several outputs of the binary counter changing simultaneously is propagated through the Exclusive-OR gates that often provide the outputs for the Gray code counter. For example, U.S. Pat. Nos. 4,119,961 and 4,618,849 disclose designs employing binary counters. While this problem may be eliminated by buffering the outputs of the logic gates with registers so that only one output will change, the addition of registers only adds to the size and weight of such Gray code counters. Additionally, the use of buffer registers also increases the complexity of the timing required for clocking the registers. Noise is also a problem in the prior art because the external clock signal must be coupled to several devices. Such coupling increases the signals that may be affected by the clock signal. Other signals lines in close proximity to the clock signal may experience interference from the clock signal which creates noise.

As noted above, Gray code counters are conventionally constructed from parts such as simple logic gates that can perform only a single function, and cannot be reprogrammed as other electrical circuits. For each part used, a stock pile of replacement parts must be maintained. Thus, there is a need for a Gray code counter that may be constructed from components already used in missile and satellite applications, thereby eliminating the need to stockpile any additional parts.

SUMMARY OF THE INVENTION

The present invention advantageously overcomes the deficiencies of the prior art by providing a nine bit Gray code counter constructed as a single integrated circuit, preferably a programable logic array. The array is programed to provide a nine bit Gray code count at its outputs. The logic array preferably includes D flip-flops, AND gates and Exclusive-OR gates. The Q output of each flip-flop provides one bit in the Gray code count. The D input to each flip-flop is determined by the significance of the bit and the following equations: $D0 = A$ XOR $Q0$; $D1 = (\overline{A} \cdot Q0)$ XOR $Q1$; $Dn = (\overline{A} \cdot \ldots \cdot Qn-2 \cdot Qn-1)$ XOR $Qn$; and $Dmsb = (\overline{A} \cdot \overline{Q0} \cdot \overline{Q1} \cdot \ldots \cdot Qmsb-2)$ XOR $Qmsb$; where "XOR" is the boolean operation of exclusive or for the operands that it is positioned between.

DETAILED DESCRIPTION OF THE PREFERRED EMBODIMENTS

Figure 1:
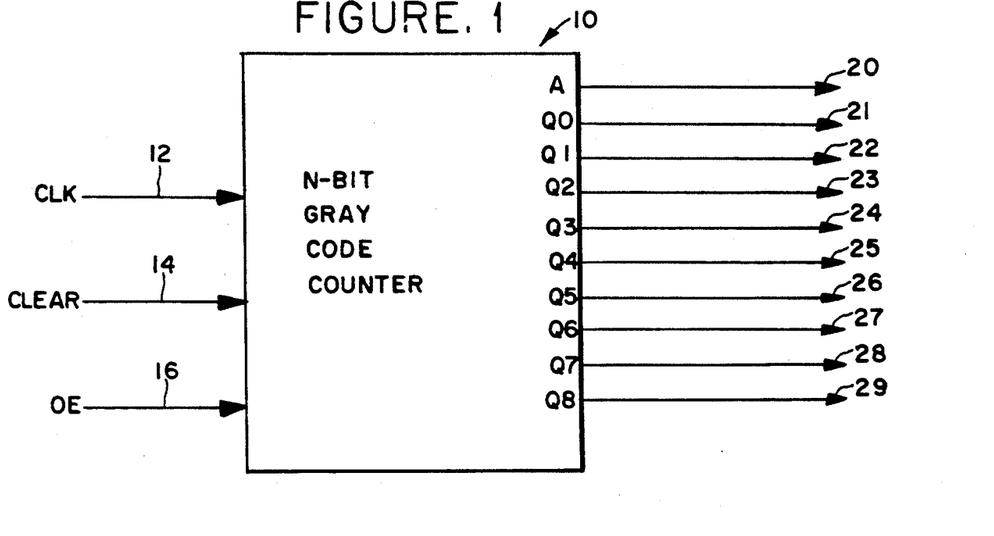
FIG. 1 is a block diagram of a preferred embodiment of the Gray code counter of the present invention.

The present invention is an N-bit counter that can be constructed as a single integrated circuit. The counter advantageously counts in Gray code to reduce amount of noise produced. Referring now to the block diagram of FIG. 1, one embodiment of a Gray code counter 10 built in accordance with the present invention is shown. While the present invention will now be described with reference to nine and five bit Gray code generators, it should be understood that the present invention can be used to produce a Gray code counter with any number of bits. Counter 10 is preferably formed as a single integrated circuit with a clock input 12, a clear input 14 and an output enable input 16. The present invention advantageously requires only a single clock input 12. A single clock input reduces the amount of noise from the clock signal and also improves the reliability of the Gray code counter 10 of the present invention because the need to interconnect the clock signal to several devices is eliminated. Counter 10 also produces a plurality of outputs 20–29 including a toggle bit A 20 and nine bits of a Gray code count from the least significant bit, Q0 21, to the most significant bit, Q8 29.

Table I shows a comparison of the decimal code, the five least significant bits of binary code, the five least significant bits of Gray code and the toggle bit. The present invention produces Gray code in which only one output transitions between each count. The counter 10 also outputs the toggle bit A with the states as shown in Table I.

TABLE I

| Decimal Code | Binary Code | | | | | Gray Code | | | | | Toggle Bit A |
|---|---|---|---|---|---|---|---|---|---|---|---|
| | B4 | B3 | B2 | B1 | B0 | Q4 | Q3 | Q2 | Q1 | Q0 | |
| 0 | 0 | 0 | 0 | 0 | 0 | 0 | 0 | 0 | 0 | 0 | 1 |
| 1 | 0 | 0 | 0 | 0 | 1 | 0 | 0 | 0 | 0 | 1 | 0 |
| 2 | 0 | 0 | 0 | 1 | 0 | 0 | 0 | 0 | 1 | 1 | 1 |
| 3 | 0 | 0 | 0 | 1 | 1 | 0 | 0 | 0 | 1 | 0 | 0 |
| 4 | 0 | 0 | 1 | 0 | 0 | 0 | 0 | 1 | 1 | 0 | 1 |
| 5 | 0 | 0 | 1 | 0 | 1 | 0 | 0 | 1 | 1 | 1 | 0 |
| 6 | 0 | 0 | 1 | 1 | 0 | 0 | 0 | 1 | 0 | 1 | 1 |
| 7 | 0 | 0 | 1 | 1 | 1 | 0 | 0 | 1 | 0 | 0 | 0 |
| 8 | 0 | 1 | 0 | 0 | 0 | 0 | 1 | 1 | 0 | 0 | 1 |
| 9 | 0 | 1 | 0 | 0 | 1 | 0 | 1 | 1 | 0 | 1 | 0 |
| 10 | 0 | 1 | 0 | 1 | 0 | 0 | 1 | 1 | 1 | 1 | 1 |
| 11 | 0 | 1 | 0 | 1 | 1 | 0 | 1 | 1 | 1 | 0 | 0 |
| 12 | 0 | 1 | 1 | 0 | 0 | 0 | 1 | 0 | 1 | 0 | 1 |
| 13 | 0 | 1 | 1 | 0 | 1 | 0 | 1 | 0 | 1 | 1 | 0 |
| 14 | 0 | 1 | 1 | 1 | 0 | 0 | 1 | 0 | 0 | 1 | 1 |
| 15 | 0 | 1 | 1 | 1 | 1 | 0 | 1 | 0 | 0 | 0 | 0 |
| 16 | 1 | 0 | 0 | 0 | 0 | 1 | 1 | 0 | 0 | 0 | 1 |
| 17 | 1 | 0 | 0 | 0 | 1 | 1 | 1 | 0 | 0 | 1 | 0 |
| 18 | 1 | 0 | 0 | 1 | 0 | 1 | 1 | 0 | 1 | 1 | 1 |
| 19 | 1 | 0 | 0 | 1 | 1 | 1 | 1 | 0 | 1 | 0 | 0 |
| 20 | 1 | 0 | 1 | 0 | 0 | 1 | 1 | 1 | 1 | 0 | 1 |
| 21 | 1 | 0 | 1 | 0 | 1 | 1 | 1 | 1 | 1 | 1 | 0 |
| 22 | 1 | 0 | 1 | 1 | 0 | 1 | 1 | 1 | 0 | 1 | 1 |
| 23 | 1 | 0 | 1 | 1 | 1 | 1 | 1 | 1 | 0 | 0 | 0 |
| 24 | 1 | 1 | 0 | 0 | 0 | 1 | 0 | 1 | 0 | 0 | 1 |
| 25 | 1 | 1 | 0 | 0 | 1 | 1 | 0 | 1 | 0 | 1 | 0 |
| 26 | 1 | 1 | 0 | 1 | 0 | 1 | 0 | 1 | 1 | 1 | 1 |
| 27 | 1 | 1 | 0 | 1 | 1 | 1 | 0 | 1 | 1 | 0 | 0 |
| 28 | 1 | 1 | 1 | 0 | 0 | 1 | 0 | 0 | 1 | 0 | 1 |
| 29 | 1 | 1 | 1 | 0 | 1 | 1 | 0 | 0 | 1 | 1 | 0 |
| 30 | 1 | 1 | 1 | 1 | 0 | 1 | 0 | 0 | 0 | 1 | 1 |
| 31 | 1 | 1 | 1 | 1 | 1 | 1 | 0 | 0 | 0 | 0 | 0 |

Figure 2:
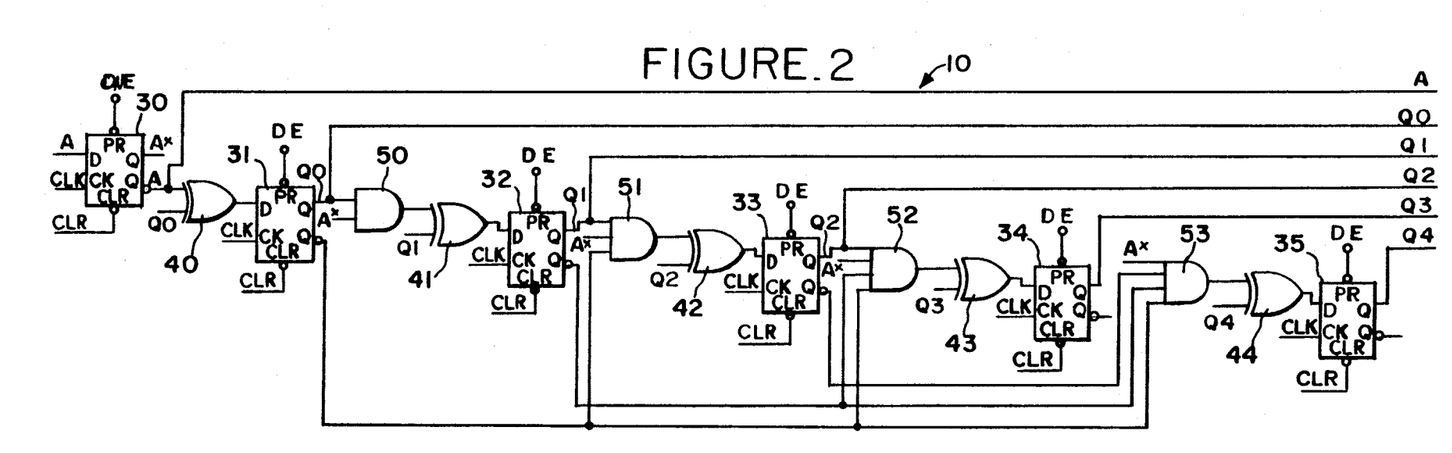
FIG. 2 is a schematic diagram of another embodiment of the Gray code counter of the present invention.

For ease of understanding, FIG. 2 shows an embodiment of the Gray code counter 10 of the present invention with five output bits. Counter 10 preferably comprises a plurality of registers such as D flip-flops 30–35, a plurality of Exclusive-OR gates 40–44, and a plurality of AND gates 50–53. The present invention provides a D flip-flop 30 for storing and providing the output of the toggle bit A and each bit of counter 10. Thus, a nine bit Gray code counter would require a total of 10 D flip-flops, while the five bit counter shown only requires 6 flip-flops 30–35. Those skilled in the art will recognize that a Gray code counter with any number of bits may be constructed in accordance with the present invention by varying the number of D flip-flops. Each of the D flip-flops 30–35 is preferably coupled to receive both the clock and clear signals as shown in FIG. 2.

In the preferred embodiment, the first flip-flop 30 is used to produce toggle bit A. Flip-flop 30 has its D input coupled to its own $\overline{Q}$ output. The $\overline{Q}$ output also provides the toggle bit A signal. Thus, each time the flip-flop 30 is clocked, its output will change from its current logical state to the other logical state. The Q output of flip-flop 30 provides the $\overline{A}$ signal.

The remaining flip-flops 31–35 each output a bit of the Gray code count. Flip-flop 31 preferably outputs the least significant bit Q0 at its Q output. Flip-flops 32–25 each output the next more significant bits. The Q output of each flip-flop 32–35 provides the Qn bit of the Gray counter.

The D input of each flip-flop 31–35 receives the signals defined by the following equations:

$$D0 = A \text{ XOR } Q0$$

$$D1 = (A \cdot Q0) \text{ XOR } Q1$$

$$D2 = (A \cdot Q0 \cdot Q1) \text{ XOR } Q2$$

$$D3 = (A \cdot Q0 \cdot Q1 \cdot Q2) \text{ XOR } Q3$$

$$D4 = (A \cdot Q0 \cdot Q1 \cdot Q2 \cdot Q3) \text{ XOR } Q4$$

Where "XOR" is the boolean operation of exclusive or and the operation is performed on the operands between which the "XOR" symbol is positioned. For the remaining flip-flops the D input of each flip-flop can be determined by the equation:

$$Dn = (A \cdot Q0 \cdot Q1 \cdot \ldots \cdot Qn-2 \cdot Qn-1) \text{ XOR } Qn,$$

where n is between 4 and the value of the most significant bit. Finally, for the most significant bit of counter 10, the D input for the flip-flop producing the most significant bit is determined by the equation:

$$Dmsb = (A \cdot Q0 \cdot Q1 \cdot \ldots \cdot Qmsb-2) \text{ XOR } Qmsb.$$

As shown in FIG. 2, the output of each of the flip-flops 30–35 is fed back through AND gates 50–53 and Exclusive-OR gates 40–44 to the inputs of the flip-flops 30–35. For example, the D input of flip-flop 31 is coupled to the output of Exclusive-OR gate 40. The inputs of Exclusive-OR gate 40 are coupled to the Q output of flip-flop 31 and the $\overline{Q}$ input of flip-flop 30. The D input of flip-flop 32 is coupled to the output of Exclusive-OR gate 41, and the inputs of Exclusive-OR gate 41 are coupled to the Q output of flip-flop 32 and the output of AND gate 50. The inputs of AND gate 50 are coupled to the Q outputs of the flip-flops 30 and 31. Similarly, the D inputs of flip-flops 33, 34 are coupled to the output of an Exclusive-OR gate 42, 43 and the AND gate 51, 52, respectfully, in accordance with the equations shown above. Finally, flip-flop 35 produces the most significant bit of the Gray code and has its D input coupled to the output of Exclusive-OR gate 44. The Exclusive-OR gate 44 has one input coupled to the Q output of flip-flop 35 and the other input coupled to the output of AND gate 53. The inputs to AND gate 53 are the signal $\overline{A}$, $\overline{Q0}$ . . . and Qmsb–2. For example, for the counter 10 of FIG. 2 that produces 5 output bits, the inputs to AND gate 53 are $\overline{A}$, $\overline{Q0}$, $\overline{Q1}$, and $\overline{Q2}$.

Figure 3:
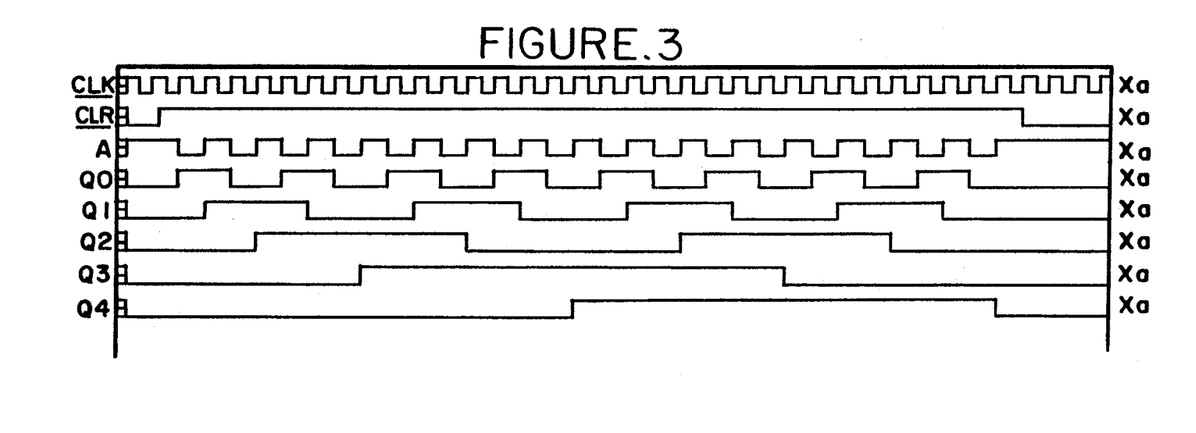
FIG. 3 is a timing diagram for the circuit of FIG. 2.

Referring now to FIG. 3, a timing diagram for the circuit of FIG. 2 is shown. As can be seen from the figure, toggle bit A alternates between the low and high states and transitions on each rising edge of the clock signal. FIG. 3 also illustrates that only a single output of the Gray count circuit of the present invention transitions per clock cycle.

Figure 4:
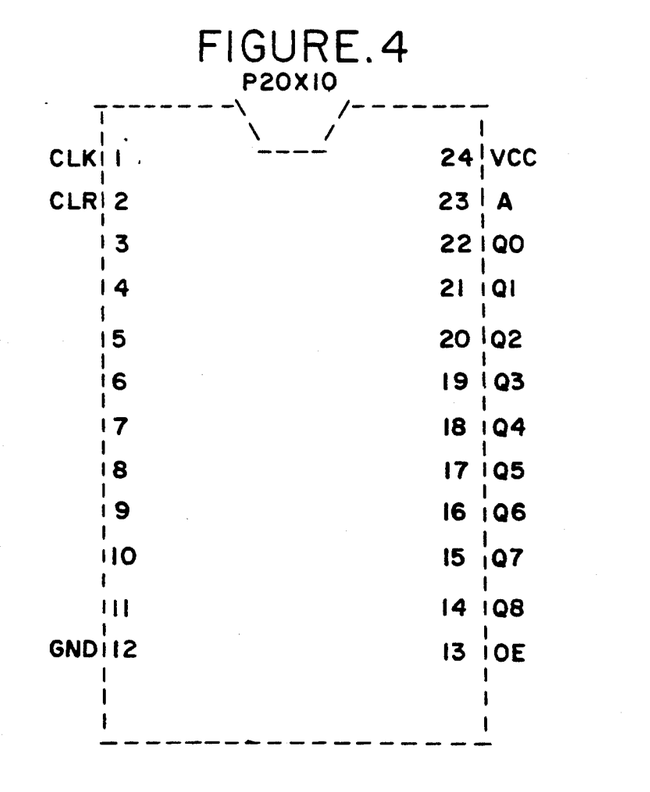
FIG. 4 is a pin out diagram for a preferred embodiment for the Gray code counter of the present invention using a programmable logic array.

In an exemplary embodiment, the present invention may be constructed with a programmable array logic (PAL) electronic device. For example, a PAL 20X10 electronic device such as a Generic Array Logic produced by Lattice Semiconductor Corporation may be used to construct a nine bit Gray code counter. The pin out configuration for such an embodiment is shown in FIG. 4. These devices may be programmed with the code and data files of Appendix A that are in the ABEL programming language using a DATA I/O array logic programmer. The actions required to generate the nine bit Gray code counter are: load the JEDEC file in the logic array programmer, place the PAL device in a socket provided on the programmer, issue the program command and verify the fuse map and operation of the counter. Thus, the present invention provides a Gray code counter that is easy to produce and may be constructed from devices such as PALs that are already used in aerospace applications, thereby, eliminating the need to stockpile additional parts.

Having described the invention in connection with certain preferred embodiments thereof, it will be understood to those skilled in the art that many modifications and variations thereto are possible, all of which fall within the true spirit and scope of this invention.

What is claimed is:
1. A device for generating an n bit Gray code count, said device comprising:
 a toggle register having inputs and outputs for transitioning between two logical states in response to a clock signal, the toggle register storing and outputting an inverse of a data input signal as an A signal;
 n registers each having a data input signal (Dn) and an output (Qn) for receiving, storing and sending data, the output (Qn) of each register providing one bit of the Gray code count;
 a plurality of logic gates having inputs and outputs for producing said data input signals for the n registers to output a Gray code count, the outputs of the plurality of logic gates coupled to respective inputs of the n registers, the inputs of the plurality of logic gates coupled to respective outputs of the n registers; and wherein the data input signal (Dn) from each logic gate coupled to each of said n registers is defined by the following equations:

$D0 = A \text{ XOR } Q0;$ $D1 = (A \cdot Q0) \text{ XOR } Q1;$ $D2 = (A \cdot Q0 \cdot Q1) \text{ XOR } Q2;$ $Dn = (A \cdot Q0 \cdot \ldots \cdot Qn-2 \cdot Qn-1) \text{ XOR } Qn;$ and $Dmsb = (A \cdot Q0 \cdot Q1 \cdot \ldots \cdot Qmsb-2) \text{ XOR } Qmsb.$ 2. The device of claim 1, wherein the registers are D flip-flops.

3. The device of claim 1, wherein the logic gates are AND gates and Exclusive-OR gates.

4. The device of claim 1, wherein n is equal to nine to provide nine registers for producing an nine bit Gray code counter.

5. The device of claim 1, wherein the device is constructed as a single integrated circuit.

6. The device of claim 5, wherein the device is programmable array logic device.

7. The device of claim 6, wherein the programmable array logic device is re-programmable so that the device may by used in other circuits.

8. The device of claim 5, wherein the integrated circuit provides a single input for receiving an external clock signal and each of the registers is coupled to the input to receive the external clock signal.

9. The device of claim 5, wherein the integrated circuit provides a single input for receiving a clear signal and each of the registers is coupled to the input to receive the clear signal.

* * * * *